United States Patent
Gerrer et al.

(10) Patent No.: US 10,242,915 B2
(45) Date of Patent: Mar. 26, 2019

(54) METHOD FOR TRANSFERRING AT LEAST ONE THIN FILM

(71) Applicant: Fraunhofer-Gesellschaft zur Förderung der angewandten Forschung e.V., Munich (DE)

(72) Inventors: Thomas Gerrer, Freiburg im Breisgau (DE); Volker Cimalla, Emmendingen (DE); Taro Yoshikawa, Freiburg im Breisgau (DE); Marina Preschle, Lahr (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 15/900,248

(22) Filed: Feb. 20, 2018

(65) Prior Publication Data
US 2018/0240709 A1  Aug. 23, 2018

(30) Foreign Application Priority Data
Feb. 21, 2017 (DE) .................. 10 2017 202 793

(51) Int. Cl.
*H01L 21/20* (2006.01)
*H01L 21/36* (2006.01)
*H01L 21/78* (2006.01)
*H01L 21/84* (2006.01)
*H01L 23/373* (2006.01)
(Continued)

(52) U.S. Cl.
CPC .......... *H01L 21/7806* (2013.01); *H01L 21/84* (2013.01); *H01L 23/3732* (2013.01); *H01L 24/80* (2013.01); *H01L 27/1218* (2013.01); *H01L 2224/80006* (2013.01);
(Continued)

(58) Field of Classification Search
None
See application file for complete search history.

(56) References Cited

U.S. PATENT DOCUMENTS

| 4,883,561 A | 11/1989 | Gmitter et al. |
| 7,595,507 B2 | 9/2009 | Francis et al. |

(Continued)

FOREIGN PATENT DOCUMENTS

EP  1 658 622  1/2016

OTHER PUBLICATIONS

Kenneth K. Chu et al., "Low-Temperature Substrate Bonding Technology for High Power GaN-on-Diamond HEMTs," 2014 Lester Eastman Conference on High Performance Devices (LEC), Electronic ISBN 978-1-4799-6441-3, dated Nov. 13, 2014, pp. 1-4, published by IEEE, Ithaca, NY.

(Continued)

*Primary Examiner* — Thien F Tran
(74) *Attorney, Agent, or Firm* — Brinks Gilson & Lione

(57) ABSTRACT

A method for transferring at least one thin film from a first substrate to a second substrate is provided, the thin film having a first side and an opposing second side and the second side of the thin film being arranged on a first side of the first substrate, at least part of the first substrate being subsequently removed and the second substrate being brought into contact, via its first side, with the second side of the thin film, wherein a liquid is supplied to the contact surface and then at least some of the liquid is removed by rotating the thin film and the second substrate.

18 Claims, 4 Drawing Sheets

(51) Int. Cl.
*H01L 23/00* (2006.01)
*H01L 27/12* (2006.01)
(52) U.S. Cl.
CPC ............... *H01L 2224/80085* (2013.01); *H01L 2224/80894* (2013.01); *H01L 2224/80948* (2013.01)

(56) References Cited

U.S. PATENT DOCUMENTS

| | | |
|---|---|---|
| 8,283,672 B2 | 10/2012 | Francis et al. |
| 8,759,134 B2 | 6/2014 | Ejeckam et al. |
| 9,536,912 B2 | 1/2017 | Nakazumi et al. |
| 2004/0159343 A1 | 8/2004 | Shimbara et al. |
| 2013/0183798 A1 | 7/2013 | Francis et al. |

OTHER PUBLICATIONS

Felix Ejeckam et al., "Gan-on-Diamond Wafers: Recent Developments," 2015 China Semiconductor Technology International Conference, Electronic ISBN 978-1-4799-7241-8, dated Jul. 13, 2015, pp. 1-3, published by IEEE, Shanghai, China.

D. Francis et al., GaN-HEMT Epilayers on Diamond Substrates: Recent Progress, 2007 International Conference on Compound Semiconductor Manufacturing Technology, dated May 17, 2007, pp. 1-4, published by CS Mantech, Austin, TX.

Yoonjin Won et al., Fundamental Cooling Limits for High Power Density Gallium Nitride Electronics, IEEE Transactions on Components, Packaging and Manufacturing Technology, ISSN 2156-3950, dated Jun. 6, 2015, pp. 737-744, vol. 5, No. 6, published by IEEE, Piscataway, NJ.

E. Yablonovitch et al., "Van der Waals bonding of GaAs on Pd leads to a permanent, solid-phase-topotaxial, metallurgical bond," Applied Physics Letters, dated Oct. 3, 1991, pp. 3159-3161, vol. 59, No. 24, published by American Institute of Physics, College Park, MD.

E. Yoblonovitch et al., "Van der Waals bonding of GaAs expitaxial liftoff films onto arbitrary substrates," Applied Physics Letters, dated Apr. 13, 1990, pp. 2419-2421, vol. 56, No. 24, published by American Institute of Physics, College Park, MD.

U. Gösele et al., "Wafer Bonding: A Flexible Approach to Materials Integration," Interface, dated 2000, pp. 20-25, published by The Electrochemical Society, Pennington, NJ.

Z. L. Liau, "Semiconductor wafer bonding via liquid capillarity," Applied Physics Letters, dated Jun. 6, 2000, pp. 651-653, vol. 77, No. 5, published by American Institute of Physics, College Park, MD.

Javier Atencia et al., "Simple and reversible bonding of glass to glass, quartz and sapphire wafers," dated May 14, 2009, pp. 1-4, published by Royal Society of Chemistry, London, UK.

METHOD FOR TRANSFERRING AT LEAST ONE THIN FILM

CROSS-REFERENCE TO RELATED APPLICATIONS

This application claims priority under 35 USC § 119 to German patent application DE 10 2017 202 793.2 filed on Feb. 21, 2017.

DETAILED DESCRIPTION

Figure 1:
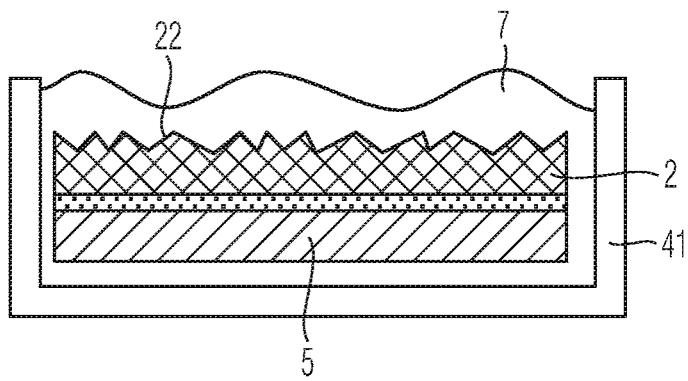
FIG. 1 shows a preparation of a second substrate in an embodiment of the invention.

The invention relates to a method for transferring at least one thin film from a first substrate to a second substrate, the thin film having a first side and an opposing second side and the second side of the thin film being arranged on a first side of the first substrate, at least part of the first substrate being subsequently removed and the second substrate being brought into contact, via its first side, with the second side of the thin film, wherein a liquid is supplied to the contact surface. Such methods can be used e.g. to remove semiconductor components from a growth substrate and apply them to a heat spreader.

E. Yablonovitch, D. M. Hwang, T. J. Gmitter, L. T. Florez and J. P. Harbison: Van der Vals Bonding of GaAs epitaxial liftoff films onto arbitrary substrates, Appl. Phys. Lett. 56 (1990) 2419 disclose to deposit a multilayer system containing $Al_xGa_{1-x}As$ on a substrate which largely consists of GaAs. A sacrificial layer made of AlAs shall be arranged between the substrate and the layer system. This sacrificial layer can be dissolved in hydrofluoric acid (HF) to separate the multilayer system from the substrate.

Thereafter, the thin-film system shall be applied to a substrate by adding water. This second substrate can contain e.g. glass, silicon or diamond. Finally, the water shall be pressed out at the contact surface and dried at elevated temperature so as to produce a permanent connection of the thin film on the second substrate.

However, this known method has the drawback that it is not suitable for large-area thin-film systems. The intermediate layer between thin film and substrate cannot be removed by etching large areas within economically acceptable periods of time and the water which is always left at the transition between thin film and second substrate cannot fully evaporate in the case of comparatively large thin films and substrates. As a result, the adhesive strength between the thin film and the second substrate is only insufficient and trapped water can destroy the film when stressed at a later date.

Proceeding from the prior art, the object of the invention is thus to provide a method for transferring at least one thin film from a first substrate to a second substrate, which is also suitable for large-area substrates, avoids time-consuming polishing of the contact surfaces and renders possible a temperature-stable and reliable connection of the thin film on the second substrate.

The invention proposes a method for transferring at least one thin film from a first substrate to a second substrate. In some embodiments of the invention, the thin film can be at least one layer of a III-V compound semiconductor. In some embodiments of the invention, the thin film within the meaning of the present description can contain or consist of a layer system comprising a plurality of individual layers. The individual layers can have different compositions, e.g. different III-V compound semiconductors and/or be doped differently. In particular, the thin film can contain a plurality of individual layers, in each case having a binary, ternary or quaternary compound of a group-Ill nitride. In some embodiments of the invention, the thin film can be structured laterally and in this way contain at least one semiconductor component, e.g. power transistors, optoelectronic components, diodes or an integrated circuit having a plurality of such elements.

The thin film can be produced in a method known per se, e.g. by means of MBE or MOVPE or MOCVD. For this purpose, the thin film is produced on a first substrate which contains, or consists of, e.g. silicon and/or $Al_2O_3$ and/or SiC and/or a compound semiconductor. The first substrate as such can, in turn, be coated with at least one thin film, e.g. to compensate for or at least reduce a lattice mismatch and/or a thermal coefficient of expansion between the first substrate and the thin film.

The second substrate can have a higher mechanical resistance and/or a higher thermal conductivity and/or a higher electrical resistance and/or a higher dielectric constant in relation to the first substrate. Therefore, the first substrate can be better suitable for the production of the thin film and/or the electronic components arranged in the thin film system and the second substrate can have advantageous effects on the operation of these electronic components. Therefore, there is a necessity to remove the thin film from the first substrate and connect it permanently and, in some embodiments of the invention also in highly temperature stable fashion, to the second substrate.

The thin film has a first side and an opposing second side. At the beginning of the method according to the invention, the second side of the thin film is arranged on the first side of the first substrate. When the thin film is deposited from the gas phase, the gaseous precursor is thus deposited on the first side of the first substrate so as to form the second side of the thin film on the contact surface. The first side of the thin film then forms the growth side of the thin film, onto which all subsequent layers of a multi-layer system are deposited and which finally forms the completion of the thin film. The opposite second side of the thin film represents the contact surface with respect to the first substrate.

The invention now proposes to remove the first substrate either in full or at least in part. As a result, the second side of the thin film is exposed in such a way that it can be brought into contact with the first side of the second substrate. According to the invention, a liquid is supplied to the contact surface. A displacement capacity of the thin film on the substrate can also be ensured by the thin liquid film between the thin film and the second substrate. The second substrate is then rotated together with the thin film arranged thereon so as to expel the liquid by the resulting forces. This reduces the distance between the thin film and the second substrate, as a result of which van der Waals forces are finally generated which connect the thin film to the second substrate with firm bond. Rough surfaces of the thin film and/or of the second substrate can be filled with remaining liquid, as a result of which the liquid fills the roughness as an adhesive addition so as to further increase the adhesion of the thin film on the second substrate. In contrast to known methods for the transfer of at least one thin film onto a substrate, neither a solder nor an adhesive is used in the present case in order to avoid the disadvantageous influences, in particular on the thermal conductivity between thin film and second substrate.

In some embodiments of the invention, the second substrate and the thin film can be held by magnetic forces at least during the rotation. Retaining forces can be produced by the application of spherical or disk-shaped magnets, as a result of which it is possible to avoid an undesired slipping out of place or removal of the thin film when the rotation starts. Therefore, the thin film can initially be reliably retained on the substrate until the liquid on the contact surface has been removed to such an extent that an independent adhesion of the thin film on the second substrate is possible.

In some embodiments of the invention, the liquid can contain or consist of a polar compound. This renders possible the generation of van der Waals forces between substrate and thin film even if the contact surface is comparatively rough. The polar liquid which is left in the rough surface can provide intermolecular bonding forces between thin film and substrate.

In some embodiments of the invention, the liquid can be selected from water and/or methanol. These liquids are available in an easy and cost-effective way, non-toxic, low-viscous and sufficiently volatile.

In some embodiments of the invention, the first substrate and/or the second substrate can have a diameter of about 5 cm to about 30 cm. In other embodiments of the invention, the second substrate can have a diameter of about 7 cm to about 12 cm. In these cases, the rotation can be carried out at a rotational speed of between about 1000 $min^{-1}$ and about 5000 $min^{-1}$ or between about 1500 $min^{-1}$ and about 4000 $min^{-1}$. The resulting forces are sufficient to reliably remove the liquid remaining on the contact surface. In some embodiments of the invention, the rotation of the second substrate with the thin film arranged thereon can take between about 10 min and about 50 min or between about 15 min and about 30 min. In contrast to known methods, the liquid is not removed merely by gravity or even merely by diffusion from the contact surface between thin film and substrate. This is accompanied by an acceleration of the method according to the invention since the liquid can be removed from the contact surface much faster under the influence of the forces resulting from the rotation. In particular but not exclusively, it is possible that in the case of large-area substrates the method becomes feasible by the rotation according to the invention since a diffusion of the liquid remaining on the contact surface would sometimes require years or decades to render possible a reliable connection of the thin film on the second substrate.

In some embodiments of the invention, the first substrate can be removed by wet-chemical or dry-chemical etching. In particular, selective etchants can here be used advantageously, said etchants attacking the material of the first substrate but not the material of the thin film. Thus, the etching operation automatically stops at the second side of the thin film so as to avoid damage to the thin film.

In some embodiments of the invention, the first side of the second substrate and/or the second side of the thin film can additionally be functionalized. This can additionally increase the bonding forces. In some embodiments, a functionalization can be effected by applying predeterminable molecules and/or by a plasma treatment of at least one side of the second substrate and/or the thin film.

In some embodiments of the invention, a mask for protection against the attack of the etchant can be applied to the edge of the second side of the first substrate. This avoids the full removal of the substrate. On the contrary, an edge or a ring and/or a supporting grid composed of material of the first substrate remains connected to the thin film. As a result, the thin film can be hereby stabilized so as to avoid an excessive curvature by mechanical stress and/or the formation of cracks and/or the propagation of cracks or fractures. Likewise the manageability of such a mechanically stabilized thin film can be facilitated. Nevertheless, the second side of the thin film is freely accessible to be connected to the second substrate.

In some embodiments of the invention, the first side of the thin film can be applied to a second auxiliary substrate to render possible a mechanical stabilization after the removal of the first substrate.

In some embodiments of the invention, at least part of the first substrate can be removed by machining. The machining operation can be carried out e.g. by milling or grinding. The machining can effect a faster removal of material than an etching method and thus can further increase the efficiency of the method proposed according to the invention. In some embodiments of the invention, the first substrate can initially be thinned by machining and then the remaining residual thickness can be fully removed by selective etching. This leads to both a faster and more economic as well as a safer process.

In some embodiments of the invention, the roughness of the second side of the thin film and/or the first side of the second substrate can be less than 10 nm or less than about 5 nm RMS. In some embodiments of the invention, the roughness of the second side of the thin film and/or of the first side of the second substrate can be more than about 1 nm or more than about 3 nm RMS. Less roughness here renders possible a reliable attachment of the thin film to the substrate. Nevertheless, it is one of the advantages of the present invention that an extremely low level of roughness of less than 1 nm or less than 0.5 nm does not exclude the use of the method but is not absolutely necessary. Therefore, the second side of the thin film and/or of the first side of the second substrate can be prepared in an easier, faster and more cost-effective way.

In some embodiments of the method according to the invention, this method can contain a further optional method step: baking the second substrate with the thin film at a temperature of about 200° C. to about 300° C. In some embodiments of the invention, this can be done in vacuo and/or in the presence of a sorbent. Due to the subsequent baking after the rotation of the second substrate, bonds between the second substrate and the thin film can be activated and/or liquid that is left on the contact surface can be evaporated and/or desorbed. As a result, the adhesive strength of the thin film on the second substrate can be further increased. In some embodiments of the invention, the adhesive strength can also be effected at higher temperatures than the baking temperatures used in the production of the compound.

In some embodiments of the invention, the second substrate can contain or consist of diamond. On the one hand, undoped diamond, which has a band gap of 5.5 eV, is a sufficiently good insulator in order to be also able to operate a plurality of electronic components on a substrate without adversely affecting them by short circuits. In addition, diamond has the highest thermal conductivity of all solids, as a result of which an electronic component within the thin film can be cooled effectively.

In some embodiments of the invention, the second substrate and/or the thin film can be stored in the liquid after the removal of the first substrate. In some embodiments of the invention, the second substrate can be applied to the second side of the thin film in a bath which contains the liquid. This serves to easily avoid the accumulation of particles. The storage and/or handling of the substrate and/or the thin film in a bath ensures that dust from the environment does not reach the contact surface between the substrate and thin film.

In some embodiments of the invention, the thin film can have a thickness of about 100 nm to about 5000 nm. In other embodiments of the invention, the thin film can have a thickness of about 500 nm to about 2000 nm. Such thin films can, in turn, be composed of a plurality of individual layers which form e.g. quantum dots, superlattices, graded buffers or, in the case of alternative or additional lateral structuring, also complex components, such as transistors, diodes or optoelectronic components, such a light-emitting diodes or semiconductor lasers or superluminescence diodes.

In some embodiments of the invention, the second substrate can have a thickness of about 100 μm to about 300 μm. On the one hand, such a substrate is sufficiently stable to avoid a mechanical damage of the thin film arranged thereon. At the same time, such a second substrate can be used as a heat spreader or as an electrical insulation layer to provide an undisturbed operation of electronic components realized in the thin film.

The invention shall be explained below by means of drawings without limitation of the general inventive concept, wherein FIGS. 1-5 show the preparation of the second substrate in an embodiment of the invention.

FIGS. 6-9 show the preparation of the thin film in an embodiment of the invention.

FIG. 10-13 show the production of a connection between the thin film and the second substrate.

Figure 14:
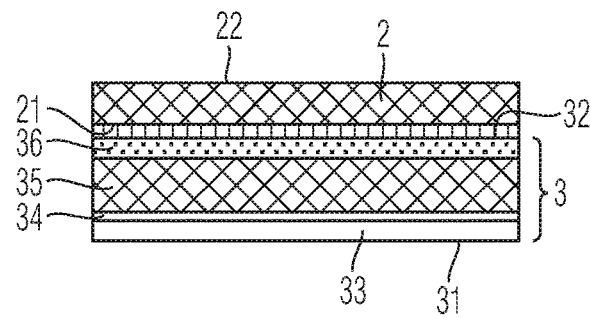
FIG. 14 shows an end product of a preceding method.

FIG. 14 shows the end product of the preceding method.

Figure 15:
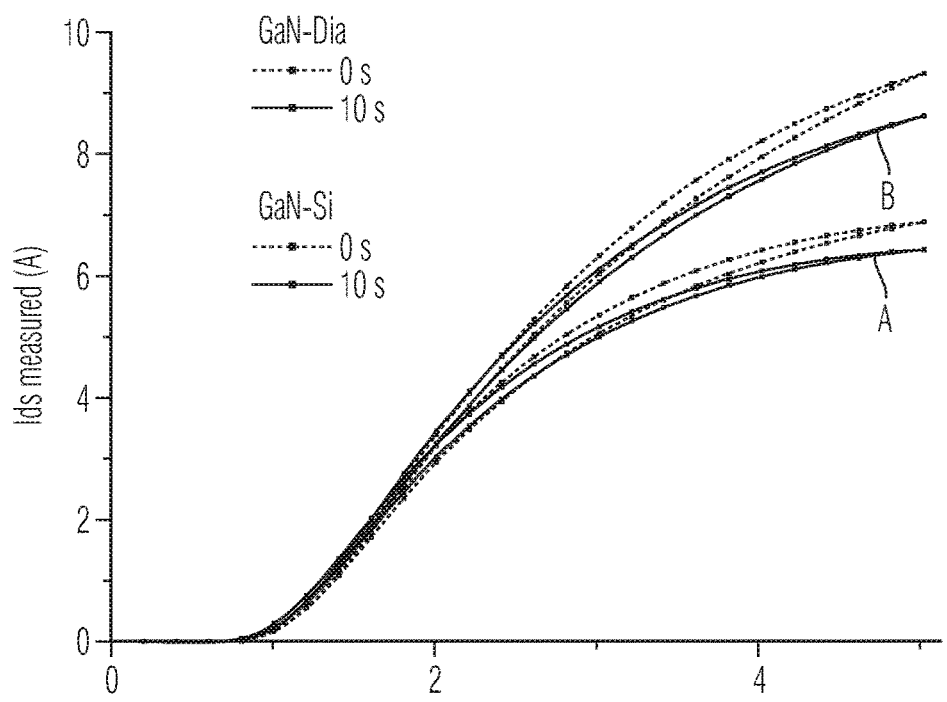
FIG. 15 shows a comparison of diode characteristic lines on a first substrate and a second substrate.

FIG. 15 shows a comparison of diode characteristic lines on the first substrate and the second substrate.

The implementation of the method according to the invention is explained in an embodiment by means of FIGS. 1 to 13. The embodiment here serves to explain the invention. However, the invention shall not be limited to the embodiment described in detail below.

The preparation of the second substrate 2 is explained in more detail by means of FIGS. 1 to 5. In the illustrated embodiment, the second substrate 2 is a diamond layer which is deposited heteroepitactically on a growth substrate 5. In some embodiments of the invention, the second substrate 2 can have a thickness of about 100 μm to about 300 μm. In other embodiments of the invention, the second substrate 2 can also have a greater thickness to about 1000 μm.

The second substrate 2 can be deposited heteroepitactically from the gas phase in the case of a diamond substrate. This is done by means of a growth substrate 5, which can have a diameter e.g. between about 7 cm and about 15 cm. The growth substrate 5 can contain or consist of e.g. silicon and/or molybdenum and/or iridium and/or strontium titanate. A person skilled in the art is familiar with the deposition of diamond on such a growth substrate 5 by means of a CVD method. The invention does not teach the use of a certain second substrate 2 as a solution principle.

As shown in FIG. 1, the growth substrate 5 is removed from the second substrate 2 in a first method step. This can be done by wet-chemical etching in an etching solution 7, which is disposed together with the second substrate 2 and the growth substrate 5 in a bath 41. The etching solution 7 can render possible a selective etching, i.e. the material of the second substrate 2 is not attacked by the etching solution, as a result of which only the growth substrate 5 is removed.

Figure 2:
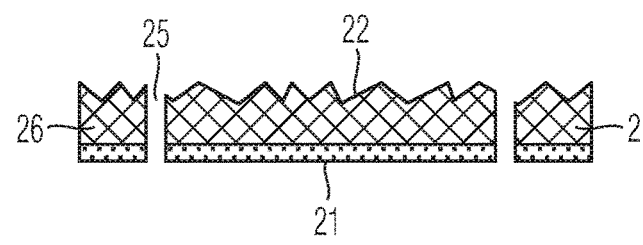
FIG. 2 shows a preparation of a second substrate in an embodiment of the invention.
Figure 3:
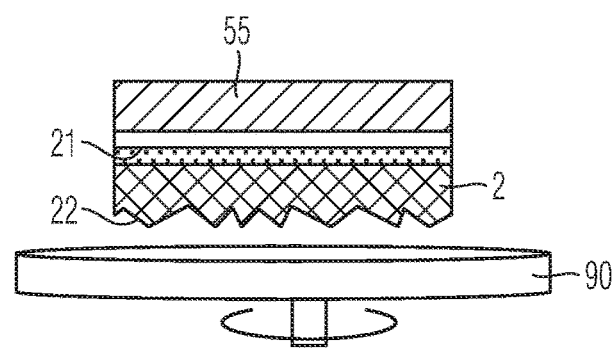
FIG. 3 shows a preparation of a second substrate in an embodiment of the invention.

FIG. 2 shows the second substrate 2 with its first side 21 and the opposing second side 22 after the removal of the growth substrate 5. The second substrate 2 can optionally be subsequently brought to a desired end format using separation cuts 25, wherein segments 26 are removed from the second substrate 2. The separation cuts 25 can be produced e.g. by laser material processing or by machining.

After the optional second method step shown by means of FIG. 2, the roughness of the second side 22 of the second substrate 2 can be reduced by grinding in a third, also optional, method step.

For this purpose, the second substrate 2 can be attached via the first side 21 to a first auxiliary substrate 55. The first auxiliary substrate 55 can be attached to the second substrate 2 e.g. by means of a wax or adhesive layer 550. Then, the second substrate 2 can be smoothed on a grinding wheel 90. However, this method step can also be omitted when the roughness of the second side 22 is either not a problem or on account of the production of the second substrate 2 such a surface roughness of the second side 22 does not exist.

Figure 4:
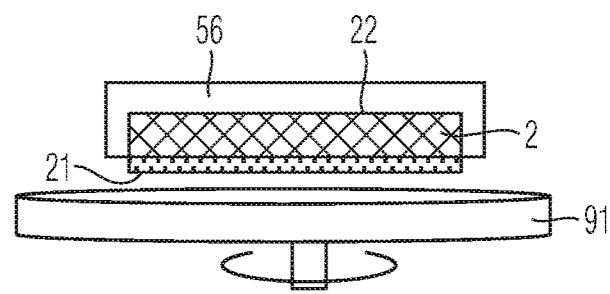
FIG. 4 shows a preparation of a second substrate in an embodiment of the invention.

In the next method step, which is explained by means of FIG. 4, the first side 21 can also optionally be smoothed by wet-chemical or dry-chemical etching or mechanical grinding and/or undesired surface contaminations, e.g. graphitic phases, can be removed from the first side 21 of the second substrate 2.

For this purpose, the second substrate 22 can be clamped via the second side 22 into a holder 56 and be guided against a grinding wheel 91. In some embodiments of the invention, this can have the effect that the roughness of the first side 21 of the second substrate 2 is less than about 10 nm or less than about 5 nm RMS. Depending on the employed method, however, the roughness can be more than about 1 nm or more than about 3 nm RMS in some embodiments of the invention.

Figure 5:
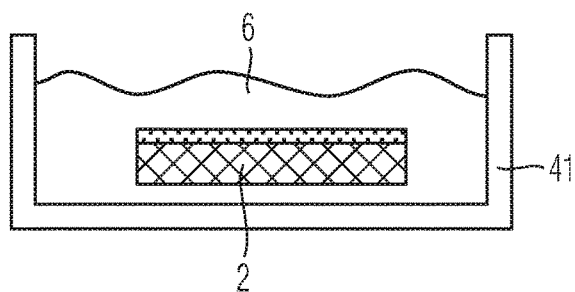
FIG. 5 shows a preparation of a second substrate in an embodiment of the invention.

When the second substrate 2 has been finished, it can still be subjected to optional cleaning steps which are not shown in the drawings and can finally be stored in a liquid 6, which is held in a container 41. This is shown in FIG. 5.

The liquid 6 can be in particular a polar liquid. In some embodiments of the invention, the liquid 6 can be water or contain water. Preferred is deionized and demineralized ultra-pure water which can also be produced in large amounts in cost-effective manner and is easily available.

The storage of the second substrate 2 in the liquid 6 avoids the contamination of the surfaces, in particular of the first side 21, which is provided to receive the thin film 3. The substrate 2 can be stored in the liquid 6 without the risk of contaminations or soiling while the thin film 3 is being prepared for the transfer to the second substrate 2, as described below by means of FIGS. 6 to 9.

Figure 6:
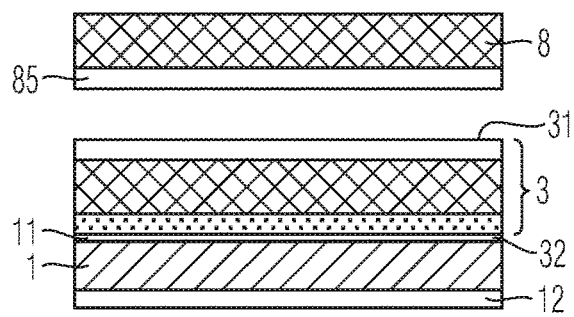
FIG. 6 shows a preparation of a thin film in an embodiment of the invention.

FIG. 6 shows a thin film 3 having a first side 31 and an opposite second side 32. The thin film 3 is arranged on a first substrate 1. The first substrate also has a first side 11 and an opposite second side 12. The thin film 3 is disposed via its second side 32 on the first side 11 of the first substrate 1.

The first substrate 1 can be or contain e.g. silicon or sapphire or glass. The first substrate 1 can be temperature stable up to above 800° C. to render possible the deposition and/or production of the thin film 3 in an MBE, MOCVD or MOVPE method.

The thin film 3 can again be composed of a plurality of individual layers. Only for the purpose of illustration, FIG. 6 shows four individual layers which are referred to in FIG. 14 by the reference signs 33, 34, 35 and 36. It should be noted that the invention does not teach the use of four individual layers as solution principle. The number of individual layers can be larger or smaller in other embodiments of the invention. The thin film 3 can also only be or contain a single layer.

In some embodiments of the invention, the thin film 3 contains a III-V compound semiconductor. In particular, the thin film 3 can contain one or more binary, ternary or quaternary compounds of a group III nitride. Electronic components, such as diodes, field effect transistors, light-emitting diodes, superluminescence diodes, semiconductor lasers or other, generally known components of power electronics or optoelectronics, can be realized within the thin film 3 by lateral structuring of the thin film 3.

In order to render possible the handling of the thin film 3 in the transfer from the first substrate 1 to the second substrate 2, the thin film 3 can optionally be applied to a second auxiliary substrate 8. In the illustrated embodiment, the second auxiliary substrate 8 is applied to the first side 31 of the thin film 3 using an intermediate layer 85. The intermediate layer 85 can contain e.g. a wax. This wax can be applied at slightly elevated temperatures of about 50 to about 100° C. or about 20 to about 80° C. in liquid or pasty form on the first side 31 of the thin film 3. After cooling down, the intermediate layer 85 forms a comparatively stable connection to the second auxiliary substrate 8. As a result of heating the auxiliary substrate 8 and the thin film 3, the intermediate layer 85 can be softened again to such an extent that the auxiliary substrate 8 and the remainders of the intermediate layer 85 can be removed from the first side 31 of the thin film 3 without any residues. This can be done at temperatures of about 200 to about 300° C. or of about 150 to about 250° C.

Figure 7:
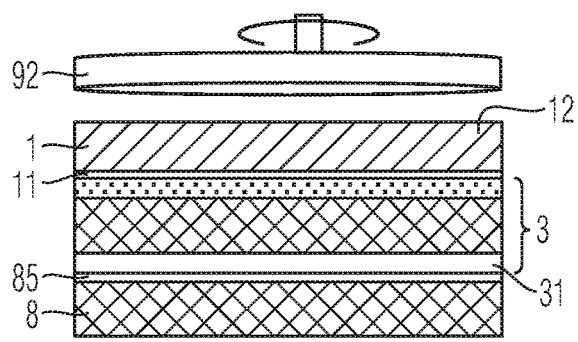
FIG. 7 shows a preparation of a thin film in an embodiment of the invention.

FIG. 7 shows an optional method step for reducing and/or thinning the first substrate 1. For this purpose, the second side 12 of the first substrate 1 is machined by means of a grinding wheel 92 to bring the first substrate 1 from its original thickness to a reduced thickness. Instead of a grinding wheel 92, it is also possible to use a milling cutter or a laser material processing operation. The machining of the first substrate 1 ends before the first substrate 1 is fully removed and the second side 32 of the thin film 3 is possibly damaged.

Figure 8:
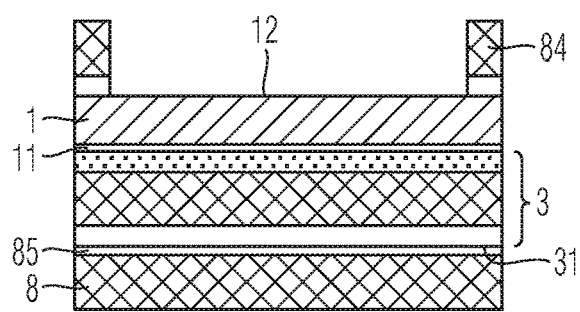
FIG. 8 shows a preparation of a thin film in an embodiment of the invention.

FIG. 8 explains the subsequent method step. For this purpose, a mask 84 is applied to the second side 12 of the first substrate 1. The mask 84 can contain e.g. a photoresist or be a hard mask, e.g. made from an oxide, a nitride or an oxinitride. In other embodiments of the invention, the mask 84 can contain or consist of a polymer, e.g. polytetrafluoroethylene. Such a mask can be applied as a plate or film to the surface of the substrate by means of bonding or clamping. The mask 84 is selected in such a way that in the subsequent wet-chemical or dry-chemical etching of the substrate 1 this mask is not attacked or is only attacked to a minor extent and prevents or reduces the attack of the etchant to the subareas of the first substrate 1, which are covered by the mask 84.

In the illustrated embodiment, the mask 84 embraces the approximately circular first substrate 1 annularly on the outer edge thereof. Since the thin film 3 at the edge of the first substrate 1 can have a poorer quality anyway, usable area of the thin film 3 is often not lost. However, it should be noted that the form of the mask 84 is merely selected by way of example. In other embodiments of the invention, the mask 84 can also adopt other forms and can be arranged e.g. in grid-like fashion on the second side 12 of the first substrate 1.

Figure 9:
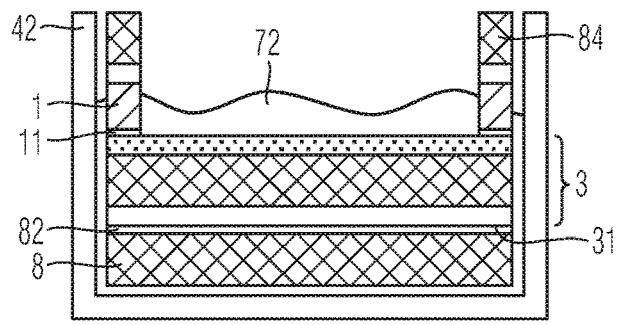
FIG. 9 shows a preparation of a thin film in an embodiment of the invention.

FIG. 9 finally shows the conduction of a wet-chemical etching process in a second etching solution 72. The second etching solution 72 is chosen in such a way that it does not attack the material of the thin film 3 but exclusively attacks the material of the first substrate 1. As a result, the etching operation stops at the second side 32 of the thin film 3 without the thin film 3 being damaged. Alternatively, it is also possible to use a dry-chemical etching step. Alternatively or additionally, it is furthermore possible to remove parts of the thin film which are not required for the subsequent function. These can be e.g. nucleation or buffer layers.

As is also evident from FIG. 9, the subareas of the first substrate 1, which are covered by the mask 84, are also protected against the corrosive attack of the second etching solution 72. As a result, a stabilizing ring is left on the second side 32 of the thin film 3 so as to avoid or at least reduce distortions or undesired curvatures on account of mechanical stresses.

Figure 10:
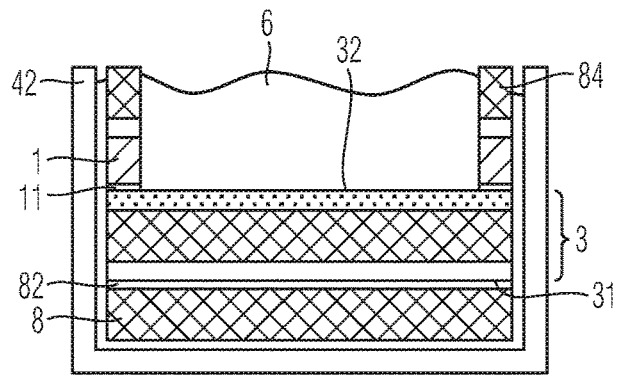
FIG. 10 shows a production of a connection between a thin film and a second substrate.

FIG. 10 shows the storage of the thus prepared thin film 3 in the liquid 6 as described above by means of the second substrate 2. The second side 32 of the thin film 3 also remains free from contaminations. It goes without saying that the order of the method steps according to FIGS. 6 to 10, on the one hand, and FIGS. 1 to 5, on the other hand, can also proceed simultaneously or initially the thin film and then the substrate can be prepared in accordance with the above description. The invention does not teach the observance of a certain order as a solution principle.

Figure 11:
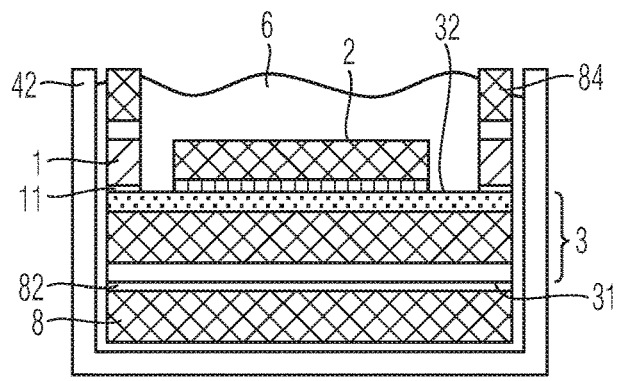
FIG. 11 shows a production of a connection between a thin film and a second substrate.
Figure 12:
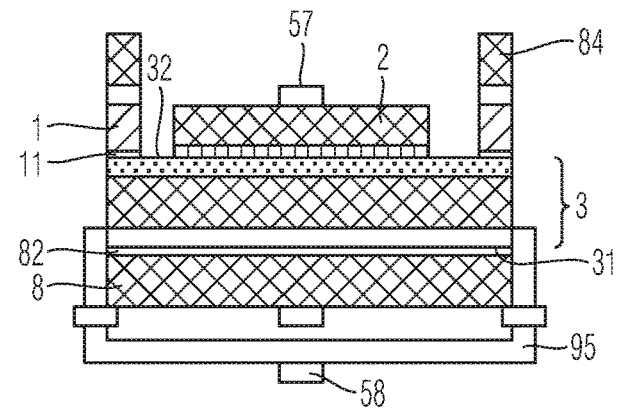
FIG. 12 shows a production of a connection between a thin film and a second substrate.

FIG. 11 finally shows how the second substrate 2 is applied via its first side 21 to the second side 32 of the thin film 3. This is carried out in the bath of the liquid 6 so as to avoid a contamination of the contact surface formed by the first side 21 of the second substrate 2 and the second side 32 of thin film 3. The majority of the liquid 6 is displaced from the contact surface by the subsequent pressure application with a predeterminable pressure force which can also be applied in full or in part by the weight force of the second substrate 2. However, a thin liquid film is left.

The second substrate 2 is then fixed to the thin film 3 and the second auxiliary substrate 8 by mechanical clamping. In some embodiments of the invention, these clamping forces can be applied by magnets 57 and 58, which are arranged above and below.

Finally, the second auxiliary substrate 2 and optionally part of the thin film 3 are clamped in the receiving device of a spincoater 95 and the second substrate 2 with the thin film 3 is rotated at a speed of about 1000 min$^{-1}$ to about 5000 min$^{-1}$ for about 15 to about 60 min. The resulting forces cause the liquid on the contact surface between the first side 21 of the second substrate 2 and the second side 32 of the thin film 3 to migrate in such a way that it is expelled beyond the edge of the substrate 2. This leads to the formation of bonding forces between the second substrate 2 and the thin film 3.

Figure 13:
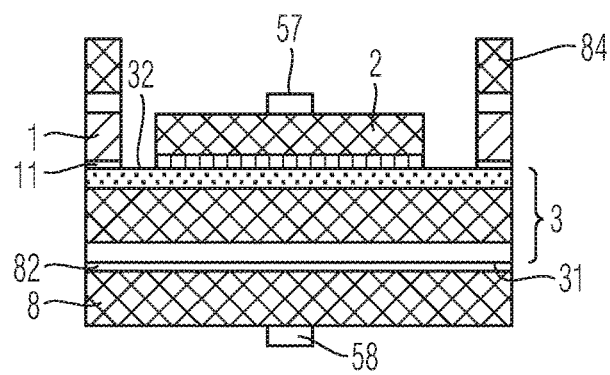
FIG. 13 shows a production of a connection between a thin film and a second substrate.

FIG. 13 shows the second auxiliary substrate 8 with the superincumbent thin film 3 and the second substrate 2 after its removal from the spincoater 95. The magnets 57 and 58 can subsequently be removed. The second auxiliary substrate 8 can be removed by heating the intermediate layer 82. Finally, the second substrate 2 with the thin film 3 arranged thereon can be cut to the desired final dimensions, whereby the remainders of the first substrate 1 and the mask 84 are also removed.

As is illustrated in FIG. 14, the thin film 3 with the individual layers 33, 34, 35 and 36 is now disposed on the second substrate 2 at the end of the method, the second side 32 of the thin film 3 being firmly connected to the first side 21 of the substrate 2. Where necessary, a tempering step can subsequently be carried out, the second substrate 2 with the thin film 3 being tempered in the presence of a sorbent and/or in a vacuum furnace at a temperature of about 50° to about 300° or of about 50° to about 200° to dispel the last remainders of the liquid 6 out of the contact surface.

The positive benefit of the present invention is explained in more detail by means of FIG. 15. FIG. 15 shows diode characteristic lines A and B, each recorded at a diode which was produced within a thin film 3 by structuring it. The dashed lines show measurement results for the pulsed operation of the diode and the full lines show a dc operation under load of 10 s each. The applied voltage is shown on the abscissa and the current flowing through the diode is shown on the ordinate. The two measurement curves A were determined while the thin film 3 with the diode was disposed on the first substrate 1, which in the illustrated embodiment was made of silicon. After the above described transfer of the thin film 3 to a second substrate, the second curve B was recorded, the second substrate being made of a diamond.

As shown by the measurement results according to FIG. 15, the identical diode achieves a markedly higher output after it is transferred to diamond, said output being characterized by the markedly higher current when an equal voltage is applied. This is true for both the dc operation and the pulsed operation. This result can be ascribed to a markedly improved heat dissipation of the second substrate. Nevertheless, the thin film 3 on this substrate cannot be produced by MBE or MOVPE. The invention thus permits the use of different substrates for the production and operation of the electronic components in the thin film 3 so as to be able to use respectively optimized substrates for the production and operation.

Of course, the invention is not limited to the illustrated embodiments. Therefore, the above description should not be considered limiting but explanatory. The below claims should be understood in such a way that a described feature is available in at least one embodiment of the invention. This does not rule out the presence of further features. If the claims and the above description define "first" and "second" embodiments, this designation serves to distinguish between two similar embodiments without determining an order.

The invention claimed is:

1. A method for transferring at least one thin film from a first substrate to a second substrate, the method comprising:
   providing the thin film having a first side and an opposing second side;
   arranging the second side of the thin film on a first side of the first substrate;
   removing at least part of the first substrate; and
   contacting a first side of the second substrate with the second side of the thin film, forming a contact surface, wherein a liquid is supplied to the contact surface, wherein at least some of the liquid is subsequently removed by rotating the thin film and the second substrate.

2. The method according to claim 1, wherein the second substrate and the thin film are held by magnetic forces, at least during the rotating.

3. The method according to claim 1, wherein the liquid comprises a polar compound.

4. The method according to claim 1, wherein the rotation is carried out with a rotational speed between about 1000 min−1 and about 5000 min−1 or between about 1500 min−−1 and about 4000 min−1.

5. The method according to claim 1, wherein the first substrate is removed by means of wet-chemical or dry-chemical etching.

6. The method according to claim 5, wherein a mask for protection from the attack of an etchant is applied to an edge of a second side of the first substrate.

7. The method according to claim 1, wherein part of the first substrate is removed by machining.

8. The method according to claim 1, wherein a roughness of at least one of the second side of the thin film or the first side of the second substrate is less than about 10 nm or less than about 5 nm RMS.

9. The method according to claim 1, further comprising baking the second substrate with the thin film at a temperature that is in a range of about 50° C. to about 300° C.

10. The method according to claim 9, wherein the second substrate is backed in vacuo, in the presence of a sorbent, or both.

11. The method according to claim 1, wherein the second substrate includes diamond.

12. The method according to claim 1, wherein after the removal of the first substrate, at least one of the second substrate or the thin film is stored in the liquid.

13. The method according to claim 1, wherein the thin film has a thickness that is in a range of about 100 nm to about 5000 nm.

14. The method according to claim 1, wherein the second substrate has a thickness that is in a range of about 100 μm to about 300 μm.

15. The method according to claim 1, wherein a roughness of at least one of the second side of the thin film or the first side of the second substrate is more than about 1 nm, or more than about 3 nm RMS.

16. The method according to claim 1, wherein the first substrate includes at least one of sapphire, silicon, SiC, or a compound semiconductor.

17. The method according to claim 1, wherein after the removal of the first substrate, the second substrate is applied to the second side of the thin film in a bath which includes a liquid.

18. The method according to claim 1, wherein the liquid is selected from at least one of water or methanol.

* * * * *